(12) United States Patent
Akkary

(10) Patent No.: US 6,697,912 B2
(45) Date of Patent: *Feb. 24, 2004

(54) PRIORITIZED CONTENT ADDRESSABLE MEMORY

(75) Inventor: Haitham Akkary, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/423,970

(22) Filed: Apr. 28, 2003

(65) Prior Publication Data

US 2003/0196035 A1 Oct. 16, 2003

Related U.S. Application Data

(63) Continuation of application No. 10/242,758, filed on Sep. 13, 2002, which is a continuation of application No. 09/466,968, filed on Dec. 20, 1999, now Pat. No. 6,493,791.

(51) Int. Cl.[7] .............................................. G06E 12/00
(52) U.S. Cl. ........................ 711/108; 711/158; 711/207
(58) Field of Search ................................ 711/108, 158, 711/207

(56) References Cited

U.S. PATENT DOCUMENTS

| | | | | |
|---|---|---|---|---|
| 5,446,686 A | * | 8/1995 | Bosnyak et al. | 365/189.07 |
| 5,588,126 A | | 12/1996 | Abramson et al. | 712/200 |
| 5,606,670 A | | 2/1997 | Abramson et al. | 711/154 |
| 5,664,137 A | | 9/1997 | Abramson et al. | 712/216 |
| 5,680,566 A | * | 10/1997 | Peng et al. | 711/206 |
| 5,694,574 A | | 12/1997 | Abramson et al. | 711/140 |
| 5,717,885 A | * | 2/1998 | Kumar et al. | 711/207 |
| 5,920,886 A | * | 7/1999 | Feldmeier | 365/168 |
| 6,006,306 A | * | 12/1999 | Haywood et al. | 365/49 |
| 6,069,573 A | * | 5/2000 | Clark et al. | 341/50 |
| 6,157,986 A | * | 12/2000 | Witt | 711/118 |

* cited by examiner

*Primary Examiner*—Reginald G. Bragdon
(74) *Attorney, Agent, or Firm*—Kenyon & Kenyon

(57) ABSTRACT

A prioritized content addressable memory having an at most one hit property despite the presence of redundant values stored therein. Redundant values within the content addressable memory are prioritized prior to performing value matching. Value matching of input data is performed only against any unique values and any highest ranked redundant value stored in the content addressable memory.

9 Claims, 5 Drawing Sheets

300

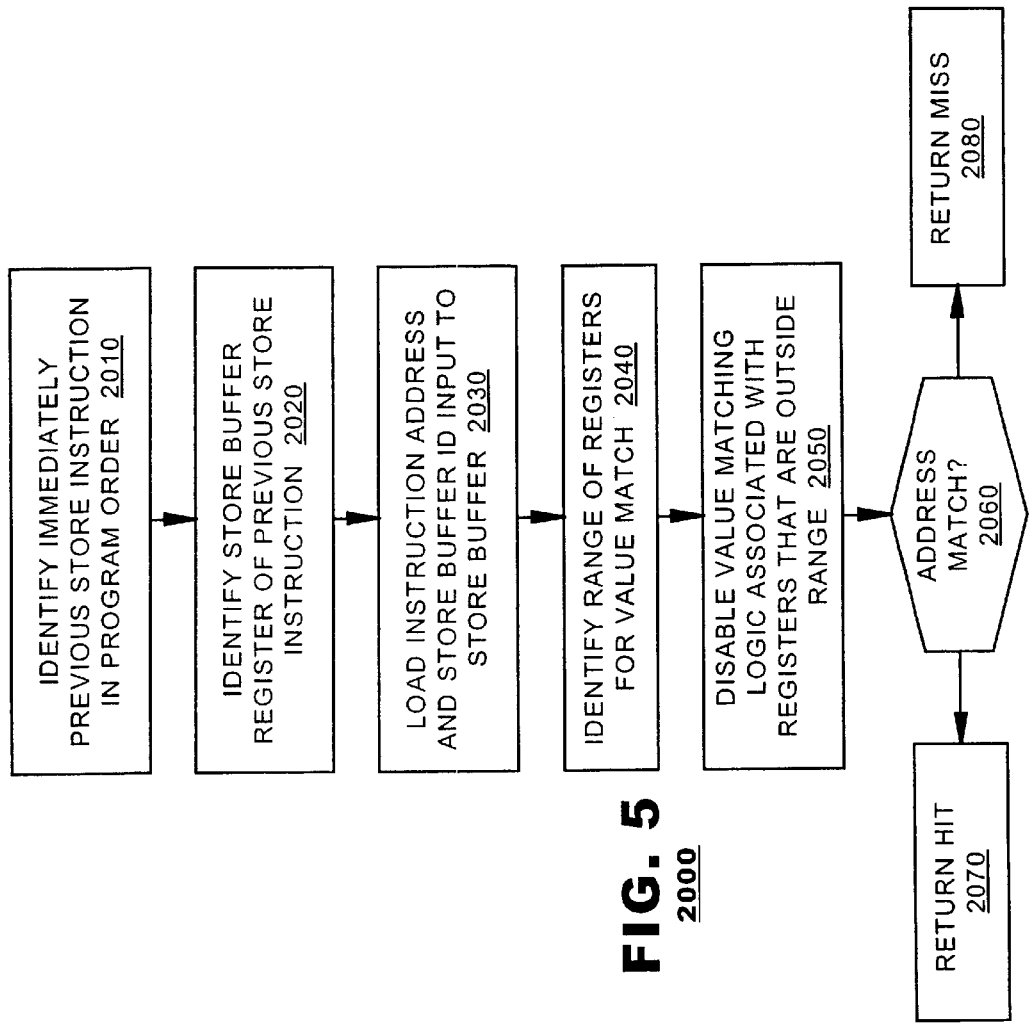

PRIORITIZED CONTENT ADDRESSABLE MEMORY

This application is a continuation application that claims the benefit of U.S. patent application Ser. No. 10/242,758 (allowed) filed Sep. 13, 2002, which is a continuation of U.S. Pat. Application Ser. No. 09/466,968 filed Dec. 20, 1999 now U.S. Pat. No. 6,493,791. The foregoing are incorporated herein in their entirety.

BACKGROUND OF THE INVENTION

The present invention relates to a data search method and apparatus for locating data in a content addressable memory.

A content addressable memory ("CAM") typically stores data in a plurality of memory locations. The CAM may include value matching logic that compares input data against the stored data and generates an indicator signal identifying those memory locations where the input value matches a stored value. A value match often is called a "hit." Such properties of CAMs are well-known.

A CAM may be used as part of a prioritized search. That is, if input data causes several hits, there may be only desired match. The desired match may be identified by a prioritization scheme that operates independently of the CAM process. In this case, a search may be performed against the matching entries to identify the one that should be identified as a match. Unfortunately, a prioritized search typically implies an entry-for-entry search of the matching locations, a process that can introduce severe latency into the search process.

By way of example, consider a CAM search that is applied to a circular FIFO queue. The search may attempt to identify an oldest match in the queue. In a straightforward search algorithm, content addressing may identify one or more matching entries. Matches may be recorded as flags in a register. If there are multiple matches, an iterative register shift might be used to identify the oldest matching location. The iterative nature of the shift takes time.

Accordingly, there is a need in the art for a fast prioritized CAM search algorithm. What is desired is a CAM that outputs at most one hit even when there are multiple matching CAM locations—the hit corresponding to the location that is ranked highest according to the priority scheme.

SUMMARY

Embodiments of the present invention provide a prioritized content addressable memory having an at most one hit property despite the presence of redundant values stored therein.

BRIEF DESCRIPTION OF THE DRAWINGS

FIG. 5 illustrates a method for determining whether a load instruction hit a store buffer according to an embodiment of the present invention.

DETAILED DESCRIPTION

Embodiments of the present invention provide a prioritized CAM that reduces the match and scan latency. Prior to receiving an input value on which to perform a value match, the prioritized CAM performs an internal value match of each entry against the others. The internal value match identifies redundant values stored throughout the CAM. Each of the redundant values are prioritized. Thus, when a new value is input to the CAM, the new value is compared against each of the redundant values having the highest priority and the unique values. Only one hit can be possible. Thus, the prioritized CAM achieves an "at most one hit" property.

Figure 1:
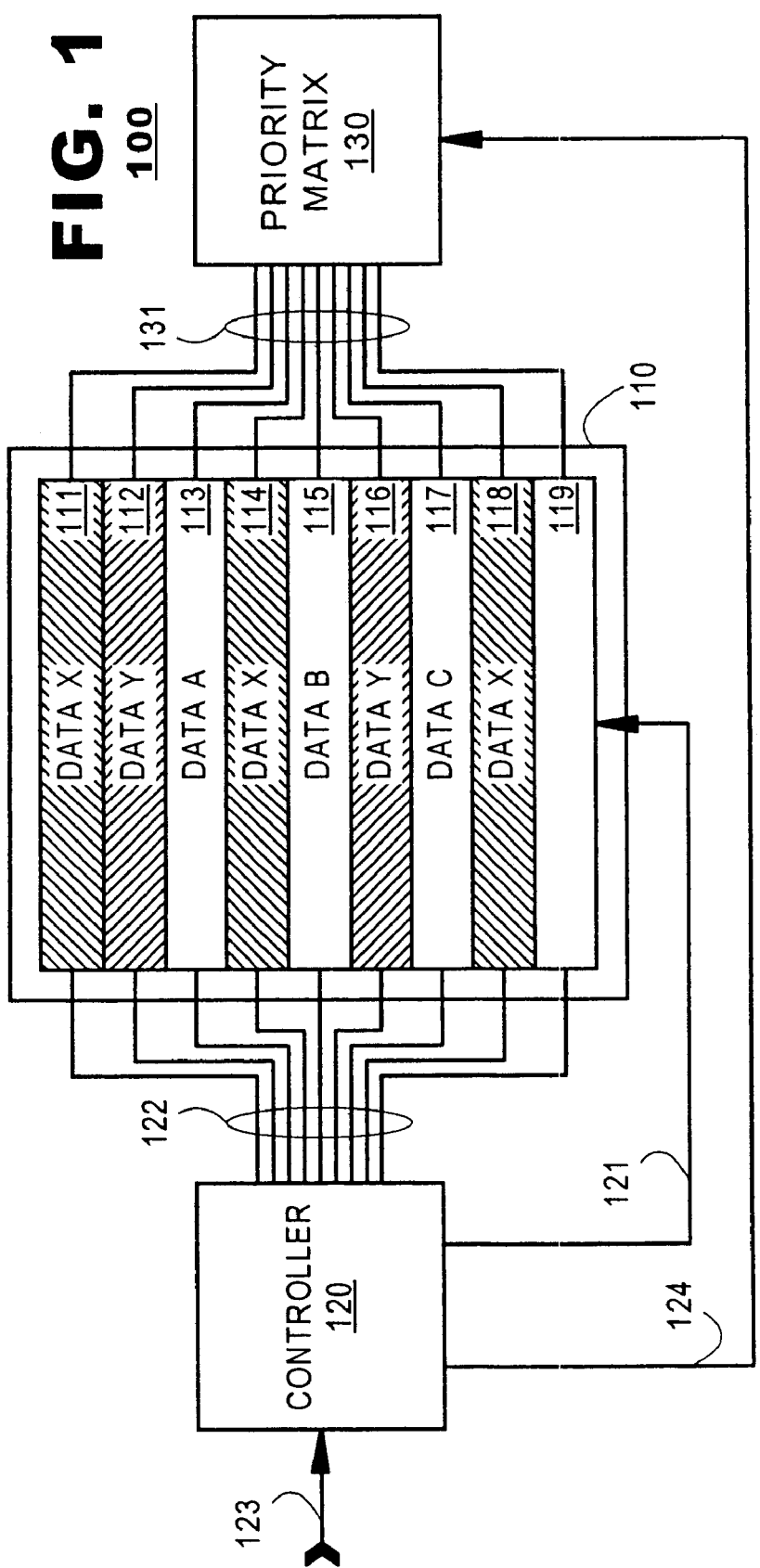
FIG. 1 illustrates a prioritized CAM according to an embodiment of the present invention.

FIG. 1 illustrates a prioritized CAM 100 according to an embodiment of the present invention. The CAM 100 may include a memory file 110, a controller 120 and a priority matrix 130. The memory file 110 may be populated by a plurality of CAM registers 111–119. While nine CAM registers are shown in the embodiment of FIG. 1, the CAM 100 may include as few or as many registers as are desired. The CAM registers 111–119 may include value matching logic that permits a comparison to be made of data stored in the registers 111–119 against an input value on line 121. Hits may be identified to the controller 120 over lines 122.

The controller 120 may receive an input data signal over input 123 and may output the input data signal to the register over line 121. The controller 120 also may control the priority matrix 130 over line 124. In one embodiment, the controller 120 may be a state machine.

The priority matrix 130 may control operation of the memory file 110 over lines 131. The priority matrix 130 may selectively disable the value matching logic of certain registers 111–119. The controller 120 may configure the priority matrix 130 over lines 124.

Figure 2:
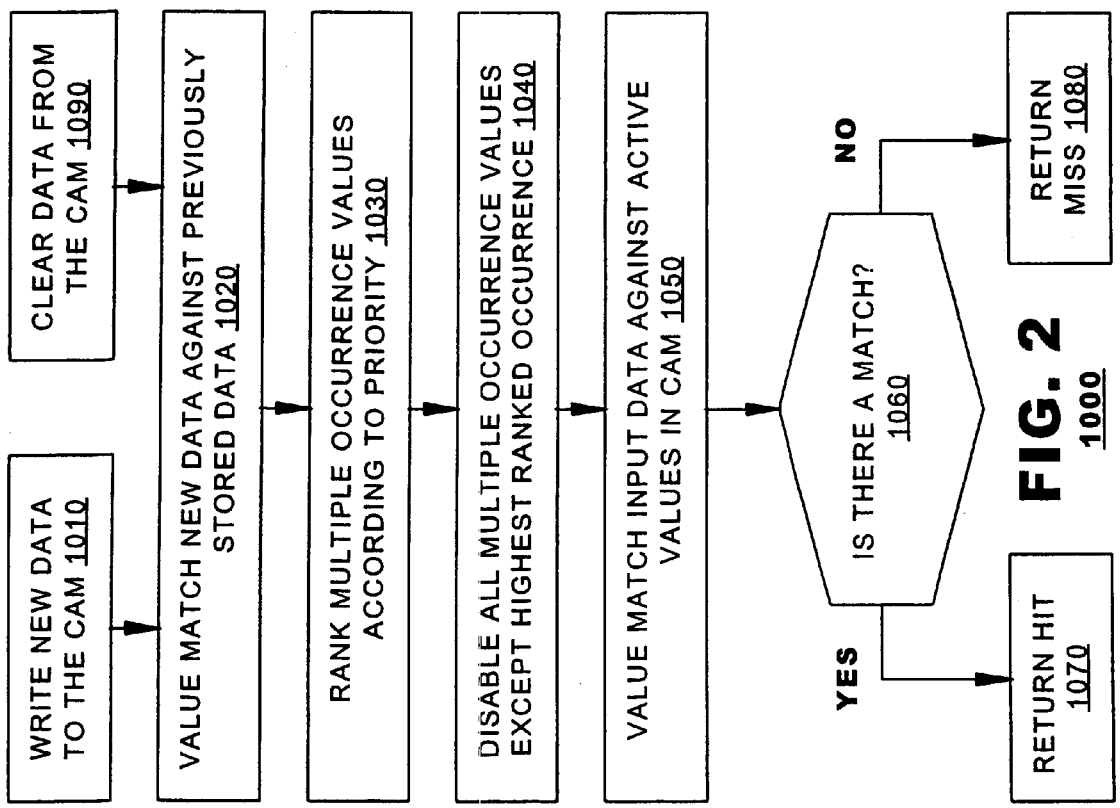
FIG. 2 illustrates a method of operation of a prioritized CAM according to an embodiment of the present invention.

FIG. 2 illustrates a method of operation 1000 of a prioritized CAM according to an embodiment of the present invention. The method 1000 may be performed by, for example, the controller 120 of FIG. 1. The method 1000 may begin when new data is written to a CAM (Step 1010). When the new data is stored in a register (say, register 119), the controller 120 may perform a value match between the new data and all previously stored data in the memory file 110 (Step 1020). The value match identifies all redundant values in the CAM 100—values of data that are stored in more than register. For each redundant value, the controller 120 may rank the redundant values based on the priority scheme (Step 1030). The controller 120 then may disable all registers that store the redundant value except the highest ranked redundant value. (Step 1040). For example, the controller 120 may configure the priority matrix 130 that, in turn, disables the registers.

At some point later, the CAM 110 may be required to perform a value match against input data (Step 1050). The value match is made against all registers 111–119 that are not disabled by the priority matrix 130. These registers will include the registers that store unique values and those registers that store the redundant values that were ranked highest according to the priority scheme. If input data matches one of these registers, the CAM 100 may indicate a hit (Steps 1060–1070); otherwise, the CAM 110 may indicate a miss (Step 1080).

In an embodiment, the method 1000 also may be repeated when data is cleared from the CAM 100 (Step 1090). In this case, at step 1020, the value match compares the value of the cleared data against the remaining data in the CAM 100.

In an alternate embodiment, the method 1000 need not be performed when clearing data from the CAM 100. In an embodiment where there is a predetermined relationship between the priority scheme and a manner in which data is cleared from the CAM, the controller 120 may configure the priority matrix 130 directly without having to perform the method 1000. An example of this feature is described below with respect to FIG. 4.

According to the method 1000, the priority matrix 130 maintains a running account of redundant values and those values that may be ranked as having the highest priority. The acts of writing data to the CAM 100 or clearing data from the CAM 100 may cause the priority matrix 130 to be updated. By maintaining this running account, it is necessary only to check the new data (the data stored in or cleared from the CAM) against the other values. It is not necessary to check all data against all other data.

By way of example, consider the CAM 100 of FIG. 1 as applied in a circular FIFO queue. To keep the presentation simple, consider an embodiment where the oldest data is stored in register 111 and the youngest data is stored in register 117. FIG. 1 illustrates specific values stored in the registers 111–117. In this example, registers 111 and 114 each store data having value X, registers 112 and 116 each store data having value Y and the remaining registers 113, 115 and 117 store non redundant values of data. Thus, without the benefits of the embodiments described above, if a value match were performed on input data having values X or Y, the CAM 100 would generate multiple hits.

The method 1000 may be invoked when a new copy of the data X is to be stored in the FIFO queue 100 at register 118. When the data is written to the register 118, the value match at step 1020 identifies two matches at registers 111 and 114. The controller 120 then prioritizes the three matching values. In an embodiment that prioritizes older values over younger values, the controller 120 may configure the priority matrix 130 to disable the value matching logic of registers 114 and 118. A subsequent value match on input data having value X would cause a match only at location 111.

Through a prior iteration of the method 1000, register 116 may have been disabled when data Y was written to it. A match between registers 112 and 116 and subsequent prioritization may have caused register 116 to be disabled.

The preceding example presented a prioritization scheme that ranked older values over younger values. This is but one example of priority. Others may prioritize younger values over older values or may base priority on types of data that may be stored in secondary portions of each register (not shown in FIG. 1). Still other priority schemes, as is discussed below with respect to FIG. 4, may base priority upon register position.

Consider, as a second example, an embodiment where the prioritized CAM 100 searches for a matching value that is in a register position closest but subsequent to a predetermined register location. In such an embodiment, when the CAM 100 receives the input value for value matching at step 1050, the CAM 100 may also receive a register ID. The register ID may indicate a search range to be used by the queue. For example, the register ID may indicate that the CAM 100 is to be searched from the position of the register ID to the end of the CAM 100. By way of example, consider an embodiment where the received input value is X and the register ID refers to register 113. In this embodiment, the CAM 100 is supposed to search from registers 113–118 for the value X.

In this second example, steps 1010–1020 may be performed identically as was described with respect to the first example above. When the value X was stored in register 118, the value match at step 1020 caused registers 111, 114 and 118 to be identified as storing the same value. In this second embodiment, the prioritization may not complete until the register ID is received into the CAM 100. However, prioritization may begin. The controller 120 may rank the redundant values in age order and load this age information into the priority matrix. When the register ID is input to the CAM 100, the controller 120 may cause any register disabling circuitry that is outside of the range identified by the register ID to be itself disabled. Thus, although the priority matrix 130 may have caused register 111 to be the only enabled register having the value X, register 111 will be itself disabled in favor of the highest ranked register that falls below the register ID (in this case, register 114). This second example demonstrates an embodiment where prioritization is partially performed when new data is written to the CAM 100 and completed when the register ID is received in association with the input data at the time the value match is to be performed.

The preceding discussion presents a prioritized CAM that identifies one of possibly many matches. The prioritized CAM is advantageous because it avoids a sequential search of matching entries. The prioritization may be performed prior to value matching and, thus, causes only one match to be detected by the CAM. This property speeds up the operation of the CAM and reduces data latency.

Figure 3:
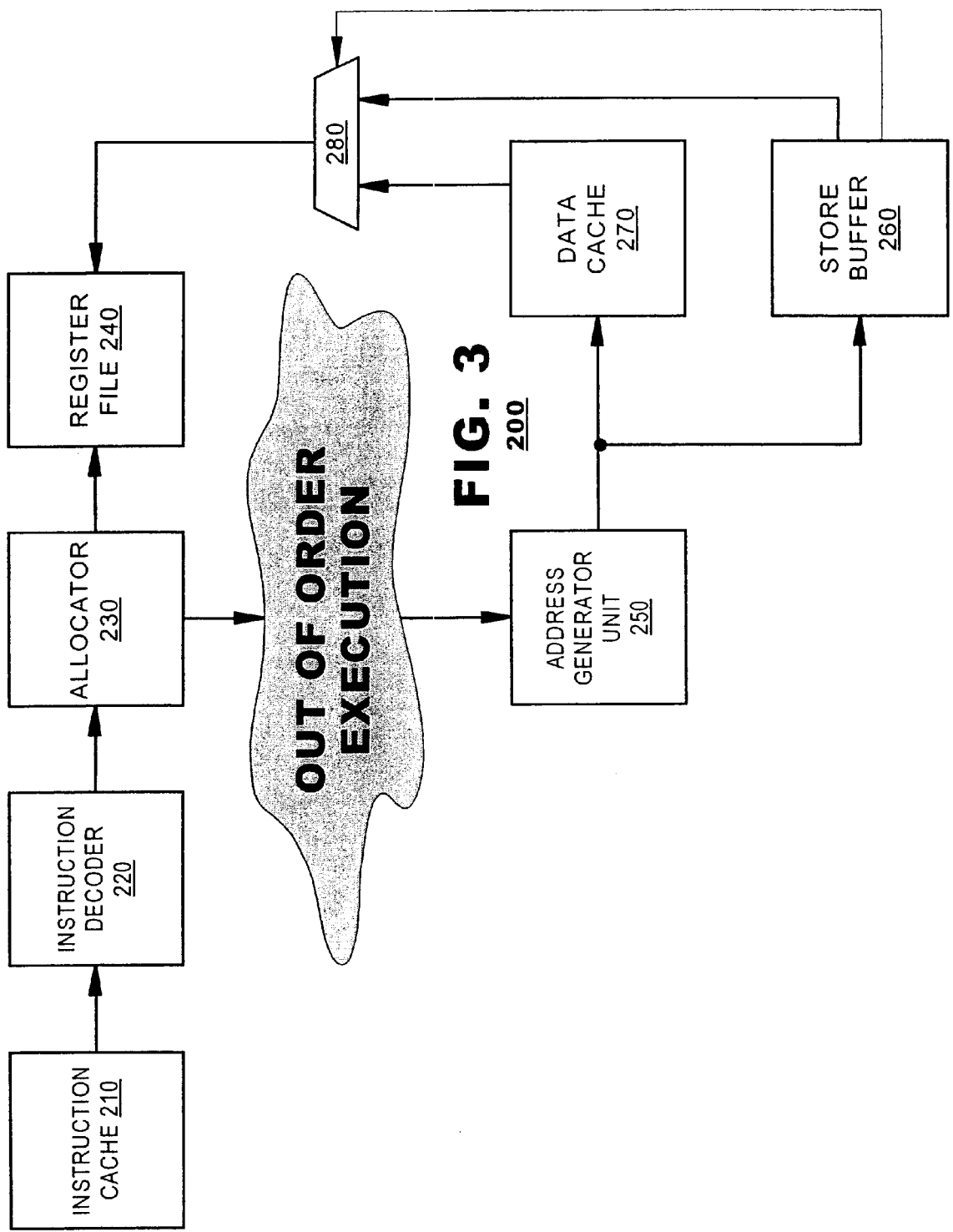
FIG. 3 is a block diagram illustrating an exemplary processor core according to an embodiment of the present invention.

FIG. 3 is a block diagram illustrating an exemplary processor core 200. The principles of the present invention may be applied to a processor core, one that benefits from out of order execution, for faster data access. The processor core 200 may be populated by an instruction cache 210, an instruction decoder 220, a register allocator 230 and a register file 240. The instruction cache 210 typically stores instructions to be executed by the processor core 200. Typically, the instructions are stored in the instruction cache 210 in program order even though the instructions may be executed out of order. The instruction decoder 220 may decode the instructions and determine how to execute them. The register allocator 230 allocates registers (not shown) in the register file 240 where result data for the instructions may be stored. The register file 240 stores the result data for the instructions. Although a processor core 200 may execute program instructions out of program order, the instruction decoder 220 and register allocator 230 typically operate on instructions in program order.

The processor core 200 may include execution logic that executes the instructions. Again, the instructions may be executed out of program order. Various well-known elements execute the instructions; they need not be discussed here. For a store instruction, however, the execution logic may include an address generation unit 250, a store buffer 260 and a data cache 270. The "data cache" 270 for the purposes of this discussion may be considered a unitary cache but, in practice, typically will be populated by a hierarchical memory system that may include internal caches (L1 and/or L2 caches), external memory and, if necessary, mass storage memories such as disks or tape memories.

A store instruction may require that data from a specified register be stored to the data cache 270. However, a store instruction may indirectly address a point in the data cache 270 where the data is to be stored. For example, the address may be defined as a base address and an offset. In this case, the address may be calculated by an address generation unit 250 prior to storage. To ensure that the store instruction does not impede the progress of other instructions that may be processed, a processor core 200 may include a store buffer 260. The store buffer 260 may include a plurality of buffer entries (not shown in FIG. 3) that provide temporary buffers for the storage of data that is to be transferred to the data cache. The buffers may be allocated by the register allocator 230 and, once allocated, entries in the store buffer may be filled over time as the out-of-order processing permits. For example, the address of a store instruction may be stored in a store buffer entry either before or after its associated data, the data that will be stored in the data cache 270, is stored in the entry.

Conventionally, a store buffer 260 may store multiple values of data that are to be transferred to the same address in the data cache 270. The data values stored in each of the store buffer entries may be different. To maintain data integrity, the store buffer 260 typically transfers data to the data cache 270 in program order.

Load instructions also may be executed with reference to the address generation unit 250, the store buffer 260 and the data cache 270. When an address is available for the load instruction, the address is compared against addresses in the store buffer 260 and the data cache 270. If the load address matches an address in the store buffer 260 ("hits" the store buffer 260), a copy of the requested data will be transferred from the store buffer 260 to the register file 230. Otherwise, the requested data will be transferred from the data cache 270. The processor core 200 may include a selector 280 that selects a data path back to the register file 240. The selector 280 may be controlled by a hit/miss indicator output from the store buffer 260.

Unlike most internal caches, where an address can cause at most one hit in the cache, the store buffer 260 can return multiple hits from an address. Before data can be read from the store buffer 260 pursuant to the load instruction, it must be determined which of the matching entries corresponds to the data as it existed at the load instruction's position in the program order. Of course, it is desired to find a matching entry as quickly as possible in order to reduce latency of the data request and improve overall system performance. The inventor proposes to construct the store buffer 260 as a prioritized CAM.

Figure 4:
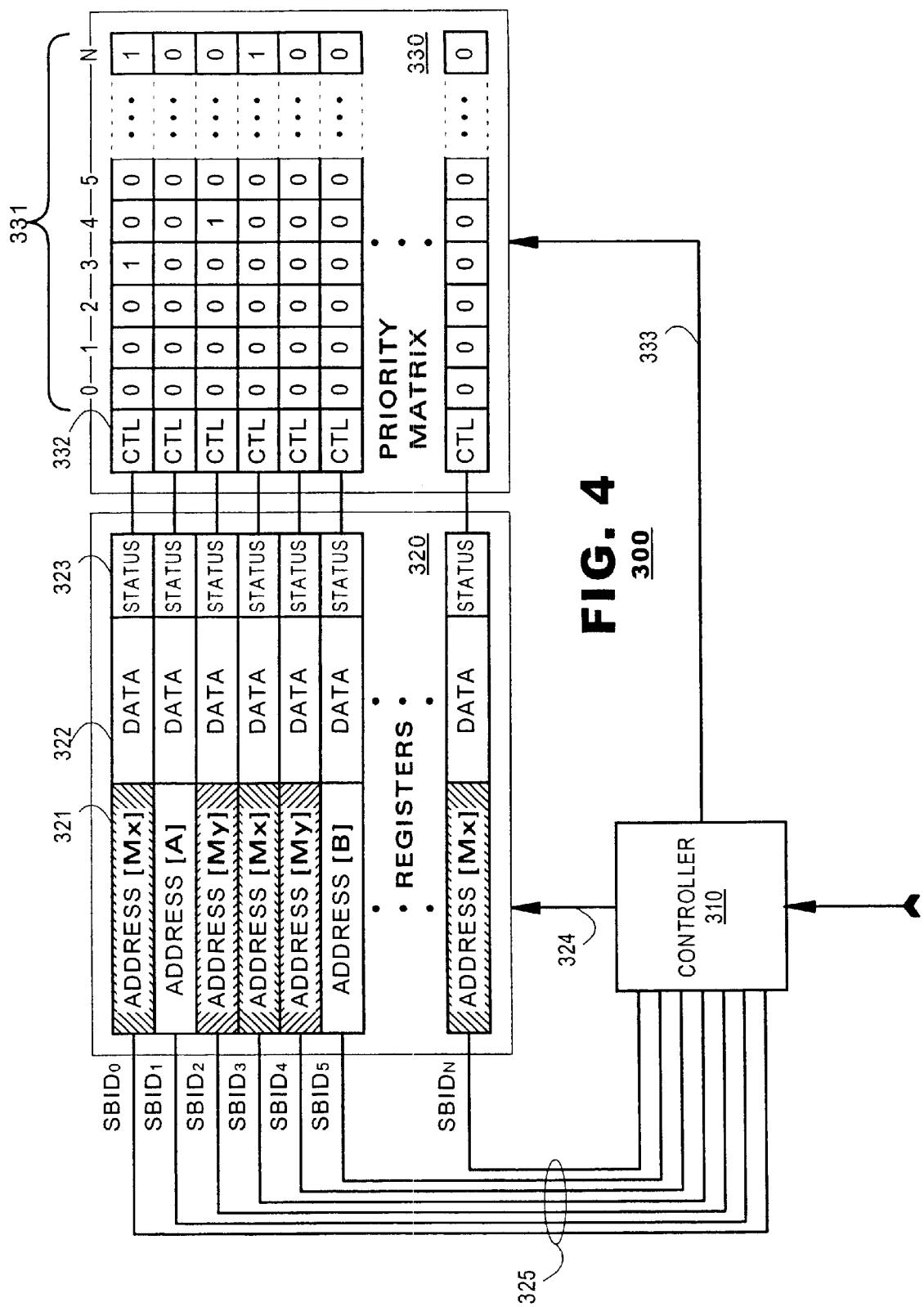
FIG. 4 illustrates a store buffer according to an embodiment of the present invention.

FIG. 4 illustrates a store buffer 300 according to an embodiment of the present invention. The store buffer 300 may operate as a prioritized CAM. It may include a controller 310, registers $SBID_0$–$SBID_N$ (collectively labeled 320) and a priority matrix 330. The store buffer 300 may operate as a "first allocated, first out" circular buffer. As described with respect to FIG. 3, registers 320 are allocated in program order. The registers 320 may evict data to the data cache 270 (FIG. 3) in order of allocation, thereby ensuring data integrity is maintained.

The registers 320 may include an address portion 321, a data portion 322 and a status portion 323. The address portion 321 may include value matching logic to permit value matches between an input address from line 324 and the addresses stored in the registers 320. The value matching logic indicates value matches to the controller 310 over lines 325.

For an N register store buffer, the priority matrix 330 may include an N by N array of flags 331. Rows of flags 331 may be constructed as extensions of respective registers 320. The priority matrix 330 also may include disabling circuitry 332 (labeled CTL) for each register that, when activated, may cause the value matching logic of the respective register to be disabled. The disabling circuitry 332 in each row may be activated in response to the flags 331 in the respective row or may be activated directly by the controller 310. The controller 310 may set the flags 331 and/or activate the disabling circuitry 332 over line 333.

Columns within the priority matrix 330 may be associated with other registers. For example, column 0 may be associated with register $SBID_0$. Flags may be set in column zero of the priority matrix for other registers to indicate relative priorities between those registers and register $SBID_0$.

In an embodiment, the store buffer 300 may operate as a CAM having a "most recently allocated" priority scheme. According to this scheme, the store buffer 300 may receive an address of a load instruction and a register ID. The store buffer 300 should perform value matching based on the load address and, if there are multiple matching entries, the store buffer 300 should generate a hit identifying the matching register that is both closest to and prior to the input register ID.

During operation, addresses and data of store instructions may be written to the store buffer 300 at random times. When a new address is to be stored in a register, the store buffer 300 may determine whether the newly stored address matches any address stored elsewhere in the registers 320. If so, the controller 310 may cause flags to be set in the priority matrix 330 in a manner that prioritizes more recently allocated registers 320 over others. Disabling circuitry 332 in each row of the priority matrix may determine whether any flags in the row are set. If so, the disabling circuitry 332 may disable the value matching logic of an associated register.

When an earlier allocated register generates a match with a later allocated register (see, registers $SBID_0$, $SBID_3$ and $SBID_N$ in FIG. 4), the controller 310 may set flags in the priority matrix 330 according to the governing priority scheme. In this embodiment, the most recently allocated scheme prioritizes entries toward the beginning of the FIFO queue (the ingress point of the queue). Thus, in the matrix row corresponding to $SBID_0$, a flag in the fourth column, the column corresponding to $SBID_3$, is set. Similarly, for registers $SBID_0$ and $SBID_3$, flags corresponding to register $SBID_N$ will be set. No other flag need be set unless there is a second earlier-allocated register that has a matching value and is ranked higher than the present register.

An embodiment having a two-dimensional priority matrix 330 has its advantages. When data is drained from a register (say, $SBID_0$), the controller 310 causes all flags in a column that corresponds to the drained register to be cleared (column 0). Otherwise, to maintain the integrity of a one-dimensional priority matrix, an internal value match would have to be run on every value in every register every time data was drained from the store buffer. The two-dimensional alternative permits a quick purge of flags that correspond to drained data. In a general purpose CAM 100 (FIG. 1), an embodiment having a two-dimensional priority matrix permits the CAM 100 to omit the method 1000 upon the eviction of data.

As discussed, embodiments of the prioritized CAM may be applied to facilitate a quick hit/miss determination when processing a load instruction. To provide a better understanding of the operation of the store buffer 300 consider the exemplary store and load instructions shown in Table 1 below.

TABLE 1

| Pos. | Program Instructions | | | Store Buffer ID |
|---|---|---|---|---|
| 1 | ST $M_x$, | DATA 1 | [DATA 1 → $M_x$] | SBID 0 |
| 2 | LD $M_x$ | | | — |
| 3 | ST $M_a$, | DATA 2 | [DATA 2 → $M_a$] | SBID 1 |
| 4 | ST $M_y$, | DATA 3 | [DATA 3 → $M_y$] | SBID 2 |
| 5 | ST $M_x$, | DATA 4 | [DATA 4 → $M_x$] | SBID 3 |
| 6 | ST $M_y$, | DATA 5 | [DATA 5 → $M_y$] | SBID 4 |
| 7 | LD $M_x$ | | | — |
| 8 | LD $M_y$ | | | — |
| 9 | ST $M_b$, | DATA 6 | [DATA 6 → $M_b$] | SBID 5 |
| 10 | ST $M_x$, | DATA 7 | [DATA 7 → $M_x$] | SBID N |
| 11 | LD $M_x$ | | | — |

Table 1 illustrates only load and store instructions from an exemplary program; there may be multiple interstitial operations (not shown) related to different operations that are routinely performed by processors. If properly executed, the LD $M_x$ instruction at position 2 in the table can cause entirely different data to be loaded into the register file 240 (FIG. 3) than the same instruction performed at position 7. Thus, when processing a load instruction out of order, the processor core must keep track of the program order to determine which value should be loaded and where in the store buffer 260 or data cache 270 the value is located.

Prior to execution, the instructions are stored in the instruction cache 210. The instructions are read out of the instruction cache 210 in order and decoded by the instruction decoder 220. An allocator also allocates core resources to accomplish the instructions. For a store instruction, the allocator 230 assigns a store buffer register to the instruction (320, FIG. 2). Thereafter, during execution, the instruction carries with it a store buffer ID that indicates which store buffer register 320 has been assigned to the instruction. According to an embodiment of the present invention, the allocator 230 may allocate registers 320 in program order. Thus, the store buffer registers themselves indicate program order.

For a load instruction that would create multiple hits at the store buffer 260 (FIG. 1), it is necessary to identify the closest store instruction having a matching address tracing backward through the program order. For example, referring to Table 1, to properly execute the instruction at position 8, the CAM search algorithm must identify the instruction stored in register no. 6, the first matching instruction as one traces backwards through the program order.

FIG. 5 illustrates a method 2000 for determining whether a load instruction hit the store buffer according to an embodiment of the present invention. According to an embodiment of the present invention, when processing a load instruction, the instruction decoder 220 identifies an immediately previous store instruction in the program order (Step 2010). It communicates with the allocator 230 and determines the store buffer ID that was assigned to the previous store instruction (Step 2020). The store buffer ID propagates with the load instruction throughout the processor core 200.

Eventually, the load instruction propagates from the address generation unit 250 and is input to the store buffer 260 (Step 2030). The controller 310 (FIG. 4) decodes the load instruction and determines a range of registers 320 on which value detection should be performed (Step 2040). The controller 310 disables the value matching logic associated with all other registers and performs the value match using the address of the load instruction (Step 2050). The controller 310 also may disable column flags associated with the out-of-range registers. There will be at most one match. If a match occurs, the controller 310 causes the contents of the matching register to be output to the selector 280 (FIG. 3) (Step 2060).

FIG. 4 illustrates the registers 320 of the store buffer 300 storing the addresses and data from the store instructions of Table 1 where the oldest store is stored in buffer 0 and the youngest store is stored in buffer N. Note that, because the core executes instructions out of order, it is possible (however unlikely) that all of the store instructions will have been loaded into the store buffer 300 prior to the execution of the first load instruction. If the controller 310 were to receive the load instruction corresponding to position 2 of Table 1, the controller 310 would identify the range of active registers 320 to extend from the register ID that accompanied the load instruction to the end of the queue. In the example of FIG. 4, the end of the queue is $SBID_0$. For instruction no. 2, the instruction decoder (220, FIG. 3) would assign $SBID_0$ to the load instruction. When it decodes the load instruction, the controller 310 would disable all columns outside of the range $SBID_0$ to $SBID_0$ and would cause the disabling circuitry 332 to disable all registers outside of the range. Thus, the value match for instruction no. 2 would be performed against the contents of one register. In the example of FIG. 4, the addresses match and the store buffer 260 would return a hit.

For instruction nos. 7 and 8, the instruction decoder would assign $SBID_4$ to both instructions. When the store buffer controller 310 decodes these instructions, the controller 310 would disable all matrix columns outside of the range $SBID_4$ to $SBID_0$ and would cause the disabling circuitry to disable the value matching logic of all registers outside of the range (registers $SBID_5$–$SBID_N$). The value match for instruction no. 7 would cause a match at register $SBID_3$. The value match for instruction no. 8 would cause a match at register $SBID_4$.

For instruction no. 11, the instruction decoder (220 FIG. 3) would assign register ID $SBID_N$ to the instruction. For this instruction, all registers 320 in the store buffer 300 would be in the search range (unless, of course, data had drained from the top of the register 320). The controller 310 would disable no flags nor would it cause the disabling circuitry 332 to disable any value matching logic. The value match would cause a match at register $SBID_N$.

As is known, address and data may be stored in the registers 320 as a result of out of order execution. There are no predetermined timing requirements on which to base a determination that a register stores valid data in either the address portion or the data portion of a register. Status information may be stored in the status portion 323 of a register. This status information may indicate, inter alia, whether the address portion and/or the data portion store valid data. In an embodiment, the status portion 323 of each register may be coupled to the value matching logic of the associated address portion 321. This embodiment would prevent a register that is known to store an invalid address in the address portion from generating a match with an input address.

Several embodiments of the present invention are specifically illustrated and described herein. However, it will be appreciated that modifications and variations of the present invention are covered by the above teachings and within the purview of the appended claims without departing from the spirit and intended scope of the invention.

We claim:

1. A method of searching a content addressable memory, comprising:
   prior to a search:
     identifying redundant values stored within the content addressable memory,
     ranking occurrences of the redundant values according to a priority scheme,
     disabling value matching logic of memory entries associated with redundant values that are ranked other than highest according to the priority scheme, and
   during a search, searching value matching logic of enabled memory entries.

2. The method of claim 1, wherein the identifying, ranking and disabling occur when new data is to be loaded in the content addressable memory.

3. The method of claim 1, wherein the priority scheme is a youngest first priority scheme.

4. The method of claim 1, wherein the priority scheme is an oldest first priority scheme.

5. A content addressable memory, comprising a plurality of registers and value matching logic, the value matching logic operative according to an at-most-one-hit property despite the presence of redundant values stored among the registers.

6. The content addressable memory of claim 5, wherein the redundant values are prioritized prior to a memory search.

7. The content addressable memory of claim 5, wherein hits from the memory are detected without having to sort through hits generated from multiple entries of the memory.

8. The content addressable memory of claim 5, wherein value matching logic from at most one register is permitted to generate a hit.

9. A content addressable memory, comprising:
   a plurality of memory entries to store data, each memory entry having value matching logic, and
   a priority matrix, having matrix entries coupled to value matching logic of respective memory entries in the content addressable memory, the matrix entries comprising a plurality of flags,
   wherein, for any matrix entry having a flag that is marked, the matrix entry causes the value matching logic of the associated memory entry to be disabled.

* * * * *